(12) United States Patent
Lee et al.

(10) Patent No.: US 7,830,282 B2
(45) Date of Patent: Nov. 9, 2010

(54) SEMICONDUCTOR DEVICE (75) Inventors: Jun-Woo Lee, Gyeonggi-do (KR);
Taek-Sang Song, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 8 days.

(21) Appl. No.: 12/344,917

(22) Filed: Dec. 29, 2008

(65) Prior Publication Data
US 2010/0109923 A1    May 6, 2010

(30) Foreign Application Priority Data
Nov. 6, 2008    (KR) ...................... 10-2008-0110075

(51) Int. Cl.
*H03M 9/00*    (2006.01)
(52) U.S. Cl. ...................... 341/101; 341/100
(58) Field of Classification Search .................. 341/100, 341/101; 375/330, 361; 326/93
See application file for complete search history.

(56) References Cited

U.S. PATENT DOCUMENTS

| | | | | |
|---|---|---|---|---|
| 5,563,594 A * | 10/1996 | Ford et al. | ................... | 341/100 |
| 5,982,309 A * | 11/1999 | Xi et al. | ...................... | 341/101 |
| 7,504,859 B2 * | 3/2009 | Aoki | .......................... | 326/68 |

* cited by examiner

*Primary Examiner*—Brian Young
(74) *Attorney, Agent, or Firm*—IP & T Group LLP (57) ABSTRACT

A semiconductor device includes a plurality of synchronization blocks configured to sequentially synchronize a plurality of input signals swinging in a complementary metal oxide semiconductor (CMOS) region with multi-phase clock signals to output a plurality of output signals swinging in a current mode logic (CML) region, a plurality of first swing region converting blocks configured to convert the plurality of output signals to a plurality of converted output signals swinging in the CMOS region, a serialization block configured to serialize a plurality of converted output signals, thereby outputting a serialized signal swinging in the CML region, and a second swing region converting block configured to convert the serialized signal to a serialized output signal swinging in the CMOS region.

15 Claims, 8 Drawing Sheets

SEMICONDUCTOR DEVICE

CROSS-REFERENCE TO RELATED APPLICATION

The present invention claims priority to Korean patent application number 10-2008-0110075, filed on Nov. 6, 2008, which is incorporated by reference in its entirety.

FIELD OF THE INVENTION

The present invention relates to semiconductor design technology, and more particularly, to a semiconductor device including a multiplexer for serializing input/output signals in response to multi-phase clock signals. The semiconductor device prevents a duty cycle ratio of the input/output signals from being distorted in a process of serializing the input/output signals.

BACKGROUND OF THE INVENTION

In general, in a semiconductor device, serializing signals means serially outputting a plurality of signals, which are inputted in parallel through a plurality of input lines, through one output line. A multiplexer has been used to serialize the signals.

However, in order for the multiplexer to serialize the signals without collision, a signal for determining when each of the signals input to the multiplexer in parallel should be outputted through one output line is required. If the semiconductor device operates in a synchronous-type mode, the signal for determining the output timing of the inputted signals should be enabled and synchronized with a system clock inputted from an external source.

Therefore, in the prior art, multi-phase clock signals are used to control an operation of the multiplexer, where the multi-phase clock signals are generated by dividing the system clock to have a predetermined phase difference.

Figure 1:
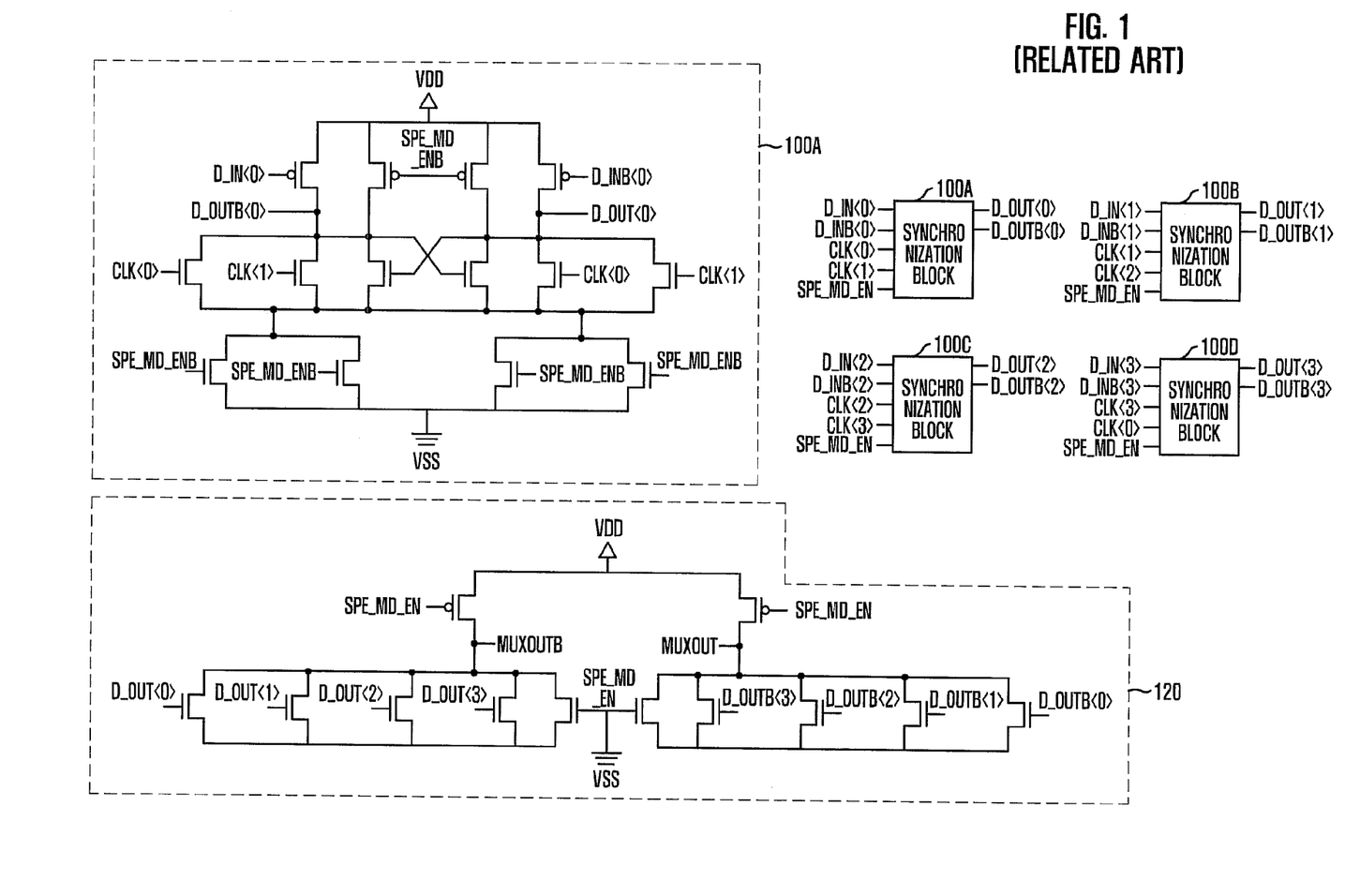
FIG. 1 illustrates a circuit diagram of a multiplexer in a conventional semiconductor device.

FIG. 1 illustrates a circuit diagram of a multiplexer for serializing input/output signals in a conventional semiconductor device.

Referring to FIG. 1, the multiplexer includes a plurality of synchronization blocks 100A, 100B, 100C, and 100D and a serialization block 120.

The plurality of synchronization blocks 100A, 100B, 100C and 100D receive a plurality of input/output signals D_IN<0>, D_INB<0>, D_IN<1>, D_INB<1>, D_IN<2>, D_INB<2>, D_IN<3> and D_INB<3> in parallel, which swing in a complementary metal oxide semiconductor (CMOS) region or a current mode logic (CML) region, and sequentially synchronizes the received input/output signals with multi-phase clock signals CLK<0>, CLK<1>, CLK<2> and CLK<3>. Therefore, a plurality of output signals D_OUT<0>, D_OUTB<0>, D_OUT<1>, D_OUTB<1>, D_OUT<2>, D_OUTB<2>, D_OUT<3> and D_OUTB<3>, which swing in the CML region, are outputted.

The serialization block 120 serializes the plurality of output signals D_OUT<0>, D_OUTB<0>, D_OUT<1>, D_OUTB<1>, D_OUT<2>, D_OUTB<2>, D_OUT<3> and D_OUTB<3>, which are outputted from the plurality of synchronization blocks 100A, 100B, 100C and 100D, respectively. The serialized signals MUXOUTB and MUXOUT are outputted.

Herein, it is noted that each of the synchronization blocks 100A, 100B, 100C, and 100D included in the conventional multiplexer is designed according to a differential scheme of simultaneously transmitting a pair of signals divided to have contrary phases. Because the plurality of synchronization blocks 100A, 100B, 100C, and 100D have the same configuration, except for inputted signals, the synchronization block 100A is illustrated in detail and will be described below for purposes of convenience. It should be understood that the description of the synchronization block 100A is applicable to the remaining blocks 100B, 100C, and 100D.

In particular, the differential input/output signals D_IN<0> and D_INB<0> having contrary phases are inputted to the synchronization block 100A. Accordingly, the synchronization block 100A synchronizes the differential input/output signals D_IN<0> and D_INB<0> with the multi-phase clock signals CLK<0> and CLK<1>, and outputs the differential output signals D_OUT<0> and D_OUTB<0>, where the output signals have contrary phases.

Likewise, it is noted that the serialization block 120 included in the conventional multiplexer is also designed according to the differential scheme to simultaneously transmit two signals having contrary phases.

In particular, the serialization block 120 receives the plurality of signals grouped into a differential signals of pairs, i.e., D_OUT<0> and D_OUTB<0>, D_OUT<1> and D_OUTB<1>, D_OUT<2> and D_OUTB<2>; and D_OUT<3> and D_OUTB<3>, from the plurality of synchronization blocks 100A, 100B, 100C, and 100D. The serialization block 120 divides and serializes the received signals into positive signals D_OUT<0>, D_OUT<1>, D_OUT<2>, and D_OUT<3>; and negative signals D_OUTB<0>, D_OUTB<1>, D_OUTB<2>, and D_OUTB<3>, to output two signals MUXOUT and MUXOUTB that have contrary phases.

As described above, since the conventional multiplexer is designed with the differential scheme of dividing its input/output signals into differential signals having contrary phases and simultaneously outputting the differential signals, the conventional multiplexer can perform the stable multiplexing although the input/output signals swinging in the CML region have a high frequency greater than a giga-hertz or dozens of giga-hertz.

However, the signals of the conventional multiplexer are determined not by their potential levels but their logic levels. That is, on the basis of a logic determination level, the input/output signals are recognized as a logic high level when they swing with a potential level higher than the logic determination level and as a logic low level when they swing with a potential level lower than the logic determination level. When controlling the input/output signals to swing in the CML region like in the conventional multiplexer, several problems may occur.

First of all, controlling the input/output signals to swing in the CMOS region will be described. Since controlling the input/output signals to swing in the CMOS region means controlling the input/output signals to full-swing between a supply voltage (VDD) level and a ground voltage (VSS) level, in a typical semiconductor device using a supply voltage (VSS) and a ground voltage (VSS) as voltage sources, the logic determination level is naturally set to a middle level between the VDD level and the VSS level and thus a region recognized as the logic high, i.e., a range of potential levels higher than the logic determination level, and a region recognized as the logic low, i.e., a range of potential levels lower than the logic determination level naturally have the same size.

However, like in the multiplexer, since controlling the signal to swing in the CML region means controlling the signal to swing between the VDD level and a potential level higher than the VSS level or between a potential level lower than the VDD level and the VSS level or between a potential level lower than the VDD level and a potential level higher than the VSS level, in the typical semiconductor device using the VDD and the VSS as voltage sources, the control for properly adjusting a reference level of the CML region is additionally required to make the region recognized as the logic high, i.e., the range of potential levels higher than the logic determination level, and the region recognized as the logic low, i.e., the range of potential levels lower than the logic determination level have the same size.

Further, the conventional multiplexer uses the differential scheme of dividing its signals into differential signals that have contrary phases and simultaneously transmitting the differential signals in order to input/output signals swinging in the CML region. At this time, in case of the differential scheme, it has an advantage of securing stability against noise that may occur during transmission of the signals swinging in the CML region. On the other hand, it has a disadvantage of requiring separate signal transmission lines for transmitting the differential signals having contrary phases and circuits for inputting/outputting the differential signals.

Specially, since the conventional multiplexer described in FIG. 1 is a circuit for directly processing signals that are inputted/outputted, the conventional multiplexer is used in a number of locations where signals are inputted/outputted in the semiconductor device. Therefore, the size of the semiconductor device including the conventional multiplexer is substantially changed according to whether the multiplexer is designed using the differential scheme of simultaneously transmitting two signals or a single-ended scheme of transmitting one signal.

Herein, if the size of the semiconductor device becomes greater, the cost of production is also increased. Therefore, in case of employing the conventional multiplexer using the differential scheme as described in FIG. 1, the size of the semiconductor device becomes much greater compared to the case of designing the multiplexer using the single-ended scheme, so that the cost of production is substantially increased.

SUMMARY OF THE INVENTION

Embodiments of the present invention are directed to a semiconductor device implementing a multiplexer, which serializes input/output signals in response to multi-phase clock signals, with a single-ended scheme.

Embodiments of the present invention are also directed to a semiconductor device capable of preventing a duty cycle ratio of input/output signals from being distorted in a process of serializing the input/output signals in a multiplexer when implementing the multiplexer with a single-ended scheme.

In accordance with an aspect of the present invention, there is provided a semiconductor device, which includes a plurality of synchronization blocks configured to sequentially synchronize a plurality of input signals swinging in a complementary metal oxide semiconductor (CMOS) region with multi-phase clock signals, and to output a plurality of output signals swinging in a current mode logic (CML) region, a plurality of first swing region converting blocks configured to convert the plurality of output signals to a plurality of converted output signals swinging in the CMOS region, a serialization block configured to serialize the plurality of converted output signals, thereby outputting a serialized signal swinging in the CML region, and a second swing region converting block configured to convert the serialized signal to a serialized output signal swinging in the CMOS region.

In accordance with an aspect of the present invention, there is provided a method for serializing a plurality of input signals inputted in parallel, the method includes sequentially outputting a plurality of output signals swinging in a CML region, in parallel, by synchronizing the plurality of input signals swinging in a CMOS region with multi-phase clock signals, converting a swing region of the plurality of output signals to the CMOS region, outputting serialized signals swinging in the CML region by serializing the converted plurality of output signals, and converting a swing region of the serialized signals swinging in the CML region to the CMOS region.

DESCRIPTION OF SPECIFIC EMBODIMENTS

Other objects and advantages of the present invention can be understood by the following description, and become apparent with reference to the embodiments of the present invention.

Figure 2:
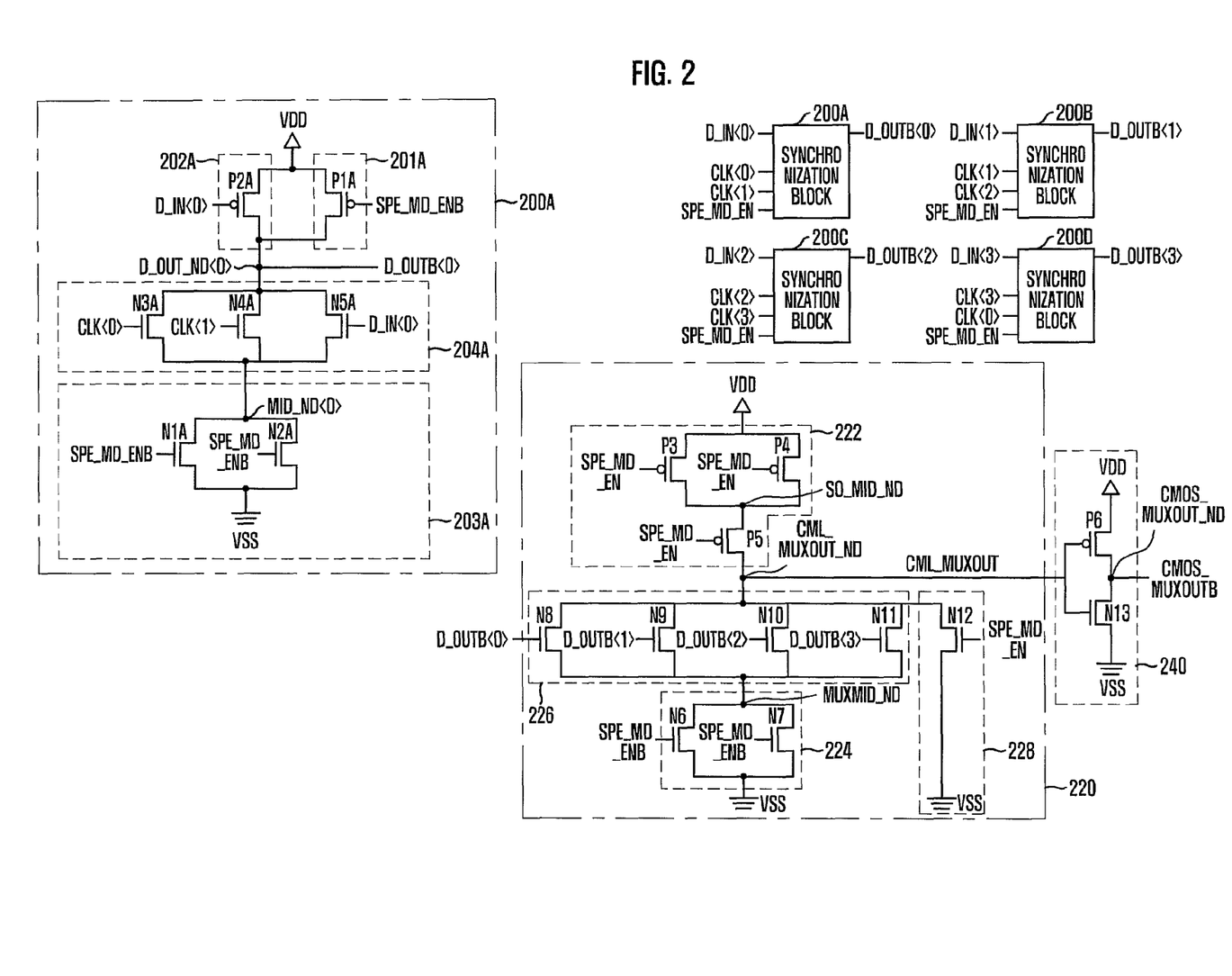
FIG. 2 illustrates a circuit diagram of a multiplexer with a single-ended scheme in a semiconductor device in accordance with a first embodiment of the present invention.

FIG. 2 illustrates a circuit diagram of a multiplexer with a single-ended scheme in a semiconductor device in accordance with a first embodiment of the present invention.

Since the multiplexer for serializing signals inputted/outputted to/from the semiconductor device in accordance with the first embodiment of the present invention employs the single-ended scheme, a plurality of input/output signals D_IN<0>, D_IN<1>, D_IN<2>, and D_IN<3> inputted in parallel to the multiplexer swings in a CMOS region and a plurality of signals D_OUT<0>, D_OUT<1>, D_OUT<2>, and D_OUT<3> outputted in series from the multiplexer also swings in the CMOS region. That is, in conventional multiplexers, when a signal swinging in a CML region is transmitted through a circuit employing the single-ended scheme, a phase of the signal may be distorted or a potential level of the signal may be changed by noise. Therefore, in the circuit employing the single-ended scheme, a signal swinging in the CMOS region should be used.

Referring to FIG. 2, the multiplexer in accordance with the first embodiment of the present invention includes a plurality of synchronization blocks 200A, 200B, 200C, and 200D, a serialization block 220, and a swing region converting block 240.

The plurality of synchronization blocks 200A, 200B, 200C, and 200D receives a plurality of input/output signals D_IN<0>, D_IN<1>, D_IN<2>, and D_IN<3>, respectively, and sequentially synchronizes the received input/output signals D_IN<0>, D_IN<1>, D_IN<2>, and D_IN<3> with multi-phase clock signals CLK<0>, CLK<1>, CLK<2>, and CLK<3>, thereby outputting a plurality of signals D_OUTB<0>, D_OUTB<1>, D_OUTB<2>, and D_OUTB<3>, respectively, where the plurality of signals D_OUTB<0>, D_OUTB<1>, D_OUTB<2>, and D_OUTB<3> swing in the CML region.

The serialization block 220 serializes the plurality of signals D_OUTB<0>, D_OUTB<1>, D_OUTB<2> and D_OUTB<3> outputted from the plurality of synchronization blocks 200A, 200B, 200C, and 200D and outputs a serialized signal CML_MUXOUT.

The swing region converting block 240 converts the serialized signal CML_MUXOUT, which includes the signals D_OUTB<0>, D_OUTB<1>, D_OUTB<2>, and D_OUTB<3> swinging in the CML region, to a serialized signal CMOS_MUXOUTB, which includes signals D_OUT<0>, D_OUT<1>, D_OUT<2>, and D_OUT<3> swinging in the CMOS region.

Herein, the plurality of synchronization blocks 200A, 200B, 200C, and 200D and the serialization block 220 are turned on/off in response to a specific mode entry control signal SPE_MD_EN. This is to prevent the current consumption in the multiplexer when the multiplexer is not required to perform the serialization operation in a specific mode of the semiconductor device. The specific mode may include a power down mode or a test mode.

Because the plurality of synchronization blocks 200A, 200B, 200C, and 200D have the same configuration, except for inputted signals, the synchronization block 200A is illustrated in detail and will be described below for purposes of convenience. It should be understood that the description of the synchronization block 200A is applicable to the remaining blocks 200B, 200C, and 200D.

The synchronization block 200A includes a first sourcing bias unit 201A, a second sourcing bias unit 202A, a first sinking bias unit 203A, and a second sinking bias unit 204A.

The first sourcing bias unit 201A provides a source current supplied through a supply voltage (VDD) terminal to a signal output node D_OUT_ND<0> in response to the specific mode entry control signal SPE_MD_EN. The second sourcing bias unit 202A is connected with the first sourcing bias unit 201A in parallel, and provides the source current to the signal output nodes D_OUT_ND<0> in response to the input/output signals D_IN<0> that swings in the CMOS region.

The first sinking bias unit 203A provides a sinking current supplied through a ground voltage (VSS) terminal to a middle node MID_ND<0> in response to the specific mode entry control signal SPE_MD_EN. The second sinking bias unit 204A provides the sinking current supplied through the middle node MID_ND<0> to the signal output node D_OUT_ND<0> in response to two or more of the multi-phase clock signals CLK<0>, CLK<1>, CLK<2>, and CLK<3>, e.g., CLK<0> and CLK<1>, and the input/output signal D_IN<0>.

Further, the first sourcing bias unit 201A includes a PMOS transistor P1A for controlling the connection of the VDD terminal and the signal output node D_OUT_ND<0> in response to an inversion signal of the specific mode entry control signal SPE_MD_ENB inputted through its gate. The PMOS transistor P1A has a source connected to the supply voltage (VDD) terminal and a drain connected to the signal output node D_OUT_ND<0>.

The second sourcing bias unit 202A includes a PMOS transistor P2A for controlling the connection of the VDD terminal and the signal output node D_OUT_ND<0> in response to the input/output signal D_IN<0> inputted through its gate. The PMOS transistor P2A has a source connected to the supply voltage (VDD) terminal and a drain connected to the signal output node D_OUT_ND<0>.

The first sinking bias unit 203A includes a first NMOS transistor N1A and a second NMOS transistor N2A. The first NMOS transistor N1A and the second NMOS transistor N2A have a gate receiving the inversion signal of the specific mode entry control signal SPE_MD_ENB, a drain connected to the middle node MID_ND<0>, and a source connected to the ground voltage (VSS) terminal.

Herein, it is noted that the first NMOS transistor N1A and the second NMOS transistor N2A practically play the same role. This construction is prepared for the case where a signal coupled to the gate of the first NMOS transistor is different from that coupled to the gate of the second NMOS transistor. For instance, the specific mode entry control signal coupled to the gate of the of first NMOS transistor N1A may be a signal for controlling a power down mode operation and the specific mode entry control signal coupled to the gate of the second NMOS transistor N2A may be a signal for controlling a test mode operation.

The second sinking bias unit 204A includes a first NMOS transistor N3A, a second NMOS transistor N4A, and a third NMOS transistor N5A. The first NMOS transistor N3A and the second NMOS transistor N4A have gates receiving two or more predetermined clock signals, e.g., CLK<0> and CLK<1>, among the multi-phase clock signals CLK<0>, CLK<1>, CLK<2>, and CLK<3>, drains connected to the signal output node D_OUT_ND<0>, and a source connected to the middle node MID_ND<0>. The third NMOS transistor N5A has a gate receiving the input/output signal D_IN<0> swinging in the CMOS region, a drain connected to the signal output node D_OUT_ND<0>, and a source connected to the middle node MID_ND<0>.

The serialization block 220 includes a sourcing bias unit 222 for providing a signal output node CML_MUXOUT_ND with the source current supplied through the VDD terminal in response to the specific mode entry control signal SPE_MD_EN, a first sinking bias unit 224 for providing a middle node MUXMID_ND with the sinking current supplied through the VSS terminal in response to the specific mode entry control signal SPE_MD_EN, a second sinking bias unit 226 for providing the signal output node CML_MUXOUT_ND with the sinking current supplied through the middle node MUXMID_ND in response to the plurality of signals D_OUTB<0>, D_OUTB<1>, D_OUTB<2> and D_OUTB<3> swinging in the CML region and outputted from the plurality of synchronization blocks 200A, 200B, 200C and 200D, and a third sinking bias unit 228 for providing the signal output node CML_MUXOUT_ND with the sinking current supplied through the VSS terminal in response to the specific mode entry control signal SPE_MD_EN.

The sourcing bias unit 222 of the serialization block 220 includes a plurality of first PMOS transistors P3 and P4 and a second PMOS transistor P5, where the first PMOS transistors P3 and P4 have gates receiving the specific mode entry control signal SPE_MD_EN, sources connected to the VDD terminal and drains connected to a sourcing middle node SO_MID_ND, and the second PMOS transistor P5 has a gate receiving the specific mode entry control signal SPE_MD_EN, a source connected to the sourcing middle node SO_MID_ND, and a drain connected to the signal output node CML_MUXOUT_ND.

It is noted that the first PMOS transistors P3 and P4 included in the sourcing bias unit 222 practically play the same role. This construction is prepared for the case a signal coupled to the gate of the PMOS transistor P3 is different from that coupled to the gate of the PMOS transistor P4. For instance, the specific mode entry control signal coupled to the gate of the PMOS transistor P3 may be a signal for controlling the power down mode operation and the specific mode entry control signal coupled to the gate of the PMOS transistor P4 may be a signal for controlling the test mode operation.

Moreover, it is noted that the first PMOS transistors P3 and P4 and the second PMOS transistor P5 included in the sourcing bias unit 222 are serially connected to each other in the same structure. This is to adjust a level range of the CML region where the plurality of signals D_OUTB<0>, D_OUTB<1>, D_OUTB<2>, and D_OUTB<3> swings by further itemizing and optimizing the amount of the source current supplied to the signal output node CML_MUXOUT_ND from the VDD terminal, wherein the plurality of signals D_OUTB<0>, D_OUTB<1>, D_OUTB<2>, and D_OUTB<3> is sequentially driven to the signal output node CML_MUXOUT_ND in a state of swinging in the CML region.

The first sinking bias unit 224 includes a plurality of NMOS transistors N6 and N7 having gates receiving the inversion signal of the specific mode entry control signal SPE_MD_ENB, drains connected to the middle node MUXMID_ND and sources connected to the VSS terminal.

Herein, it is noted that the transistors N6 and N7 practically play the same role. This construction is prepared for the case the inversion signal of the specific mode entry control signal SPE_MD_ENB coupled to the gate of the NMOS transistor N6 is different from that coupled to the gate of the NMOS transistor N7. For instance, the inversion signal of the specific mode entry control signal coupled to the gate of the NMOS transistor P6 may be a signal for controlling the power down mode operation and the inversion signal of the specific mode entry control signal coupled to the gate of the NMOS transistor N7 may be a signal for controlling the test mode operation.

The second sinking bias unit 226 includes a plurality of NMOS transistors N8, N9, N10, and N11 having gates receiving the plurality of signals D_OUTB<0>, D_OUTB<1>, D_OUTB<2>, and D_OUTB<3> that swings in the CML region and is outputted from the plurality of synchronization blocks 200A, 200B, 200C, and 200D, respectively, drains connected to the signal output node CML_MUXOUT_ND and sources connected to the middle node MUXMID_ND.

The third sinking bias unit 228 includes an NMOS transistor N12 having a gate receiving the specific mode entry control signal SPE_MD_EN, a drain connected to the signal output node CML_MUXOUT_ND and a source connected to the VSS terminal.

The swing region converting block 240 includes a PMOS transistor P6 and an NMOS transistor N13. The PMOS transistor P6 has a gate receiving an output signal CML_MUXOUT of the serialization block 220, a source connected to the VDD terminal and a drain connected to a signal output node CMOS_MUXOUT_ND. The NMOS transistor N13 has a gate receiving the output signal CML_MUXOUT of the serialization block 220, a drain connected to the signal output node CMOS_MUXOUT_ND, and a source connected to the VSS terminal.

An operation of the multiplexer employing the single-ended scheme to serialize the signals inputted/outputted to/from the semiconductor device in accordance with the first embodiment of the present invention will be described hereinafter with reference to the above-described structure.

Figure 3:
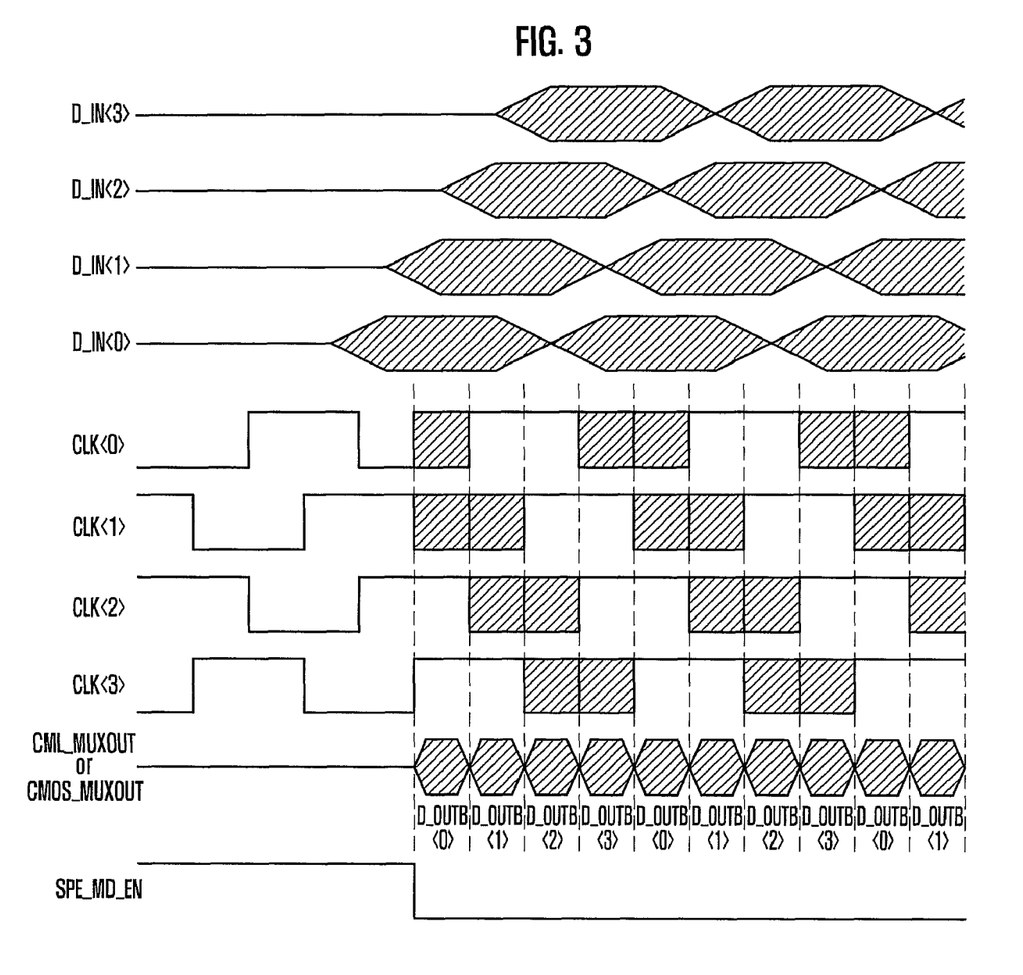
FIG. 3 illustrates an operational timing diagram of the multiplexer in the semiconductor device in accordance with the first embodiment of the present invention.

FIG. 3 illustrates an operational timing diagram of the multiplexer in the semiconductor device in accordance with the first embodiment of the present invention.

As can be seen from FIG. 3, in the multiplexer employing the single-ended scheme to serialize the signals inputted/outputted to/from the semiconductor device in accordance with the first embodiment of the present invention, although the plurality of signals D_IN<0>, D_IN<1>, D_IN<2>, and D_IN<3> swinging in the CMOS region is inputted to the plurality of synchronization blocks 200A, 200B, 200C, and 200D, in parallel, the plurality of synchronization blocks 200A, 200B, 200C, and 200D operates only at sequential time points according to the multi-phase clock signals CLK<0>, CLK<1>, CLK<2>, and CLK<3>, i.e., a time point corresponding to CLK<0> and CLK<1>, a time point corresponding to CLK<1> and CLK<2>, a time point corresponding to CLK<2> and CLK<3>, and a time point corresponding to CLK<3> and CLK<0>, respectively. Accordingly, the plurality of synchronization blocks 200A, 200B, 200C, and 200D outputs the plurality of signals D_OUT<0>, D_OUT<1>, D_OUT<2>, and D_OUT<3> swinging in the CML region to the serialization block 220 in order of precedence. The serialization block 220, serially outputs the plurality of signals D_OUT<0>, D_OUT<1>, D_OUT<2>, and D_OUT<3>, sequentially outputted from the plurality of synchronization blocks 200A, 200B, 200C, and 200D and swinging in the CML region, through the signal output node CML_MUXOUT_ND as the serialized signal CML_MUXOUT. The swing region converting block 240 converts the serialized signal CML_MUXOUT, which swings in the CML region and is outputted from the serialization block 220 to a serialized signal CMOS_MUXOUTB swinging in the CMOS region. Herein, the serialized signal CML_MUXOUT outputted from the serialization block 220 and the serialized signal CMOS_MUXOUTB outputted from the swing region converting block 240 have different swing regions while having the same waveform.

In particular, since the multiplexer does not operate in a region where the specific mode entry control signal SPE_MD_EN is enabled to a logic high level, no signal is outputted from the multiplexer. And, only in a region where the specific mode entry control signal SPE_MD_EN is disabled to a logic low level, the multiplexer operates and outputs the serialized signal CML_MUXOUT or CMOS_MUXOUTB.

Although the plurality of signals D_IN<0>, D_IN<1>, D_IN<2>, and D_IN<3> swinging in the CMOS region and having overlapping enable regions is inputted in parallel to the plurality of synchronization blocks 200A, 200B, 200C, and 200D, the serialization block 220 may serialize the signals D_OUT<0>, D_OUT<1>, D_OUT<2>, and D_OUT<3> outputted from the plurality of synchronization blocks 200A, 200B, 200C, and 200D because the enable timings of the signals D_OUT<0>, D_OUT<1>, D_OUT<2>, and D_OUT<3> are different from each other according to the multi-phase clock signals CLK<0>, CLK<1>, CLK<2>, and CLK<3>.

That is, if the $0^{th}$ and the first multi-phase clock signals CLK<0> and CLK<1>, among the multi-phase clock signals CLK<0>, CLK<1>, CLK<2>, and CLK<3>, have a logic low level, the first synchronization block 200A, among the plurality of synchronization blocks 200A, 200B, 200C, and 200D, operates and outputs the $0^{th}$ signal D_IN<0> swinging in the CMOS region as the $0^{th}$ signal D_OUT<0> swinging in the CML region. Similarly, if the first and the second multi-phase clock signals CLK<1> and CLK<2> have a logic low level, the second synchronization block 200B operates and outputs the first signal D_IN<1> swinging in the CMOS region as the first signal D_OUT<1> swinging in the CML region. If the second and the third multi-phase clock signals CLK<2> and CLK<3> have a logic low level, the third synchronization block 200C operates and outputs the second signal D_IN<2> swinging in the CMOS region as the second signal D_OUT<2> swinging in the CML region. Finally, if the third and the $0^{th}$ multi-phase clock signals CLK<3> and CLK<0> have a logic low level, the fourth synchronization block 200D operates and outputs the third signal D_IN<3> swinging in the CMOS region as the third signal D_OUT<3> swinging in the CML region.

As described above, the enable timings of the signals D_OUT<0>, D_OUT<1>, D_OUT<2>, and D_OUT<3> outputted from the plurality of synchronization blocks 200A, 200B, 200C, and 200D and swinging in the CML region are different from each other according to the multi-phase clock signals CLK<0>, CLK<1>, CLK<2>, and CLK<3>. Since the serialization block 220 serializes the signals D_OUT<0>, D_OUT<1>, D_OUT<2>, and D_OUT<3> and outputs the serialized signal CML_MUXOUT through one signal output node CML_MUXOUT_ND, the multiplexing operation for serially outputting the plurality of signals D_IN<0>, D_IN<1>, D_IN<2>, and D_IN<3> inputted to the multiplexer in parallel is completed.

At this time, although it is not shown in FIG. 3, since the plurality of signals D_IN<0>, D_IN<1>, D_IN<2>, and D_IN<3> serially inputted to the multiplexer swings in the CMOS region, the signals D_OUT<0>, D_OUT<1>, D_OUT<2>, and D_OUT<3> serialized and outputted from the multiplexer also have to swing in the CMOS region. Therefore, the swing region converting block 240 receives the plurality of signals D_OUT<0>, D_OUT<1>, D_OUT<2>, and D_OUT<3> serialized and outputted through the signal output node CML_MUXOUT_ND of the serialization block 220, and outputs the plurality of signals D_OUT<0>, D_OUT<1>, D_OUT<2>, and D_OUT<3> swinging in the CMOS region as the serialized signal CMOS_MUXOUTB through the signal output node CMOS_MUXOUT_ND.

As described above, by applying the first embodiment of the present invention to the semiconductor device, it is possible to simplify a circuit construction of the multiplexer by implementing the multiplexer for serializing the input/output signals corresponding to the multi-phase clock signals CLK<0>, CLK<1>, CLK<2>, and CLK<3> with the single-ended scheme. As a result, it is possible to significantly reduce an area occupied by the multiplexer in the semiconductor device and thus to further minimize the size of the semiconductor device.

However, when practically applying the multiplexer employing the single-ended scheme in accordance with the first embodiment of the present invention to the semiconductor device, the following problems may occur.

Figure 4:
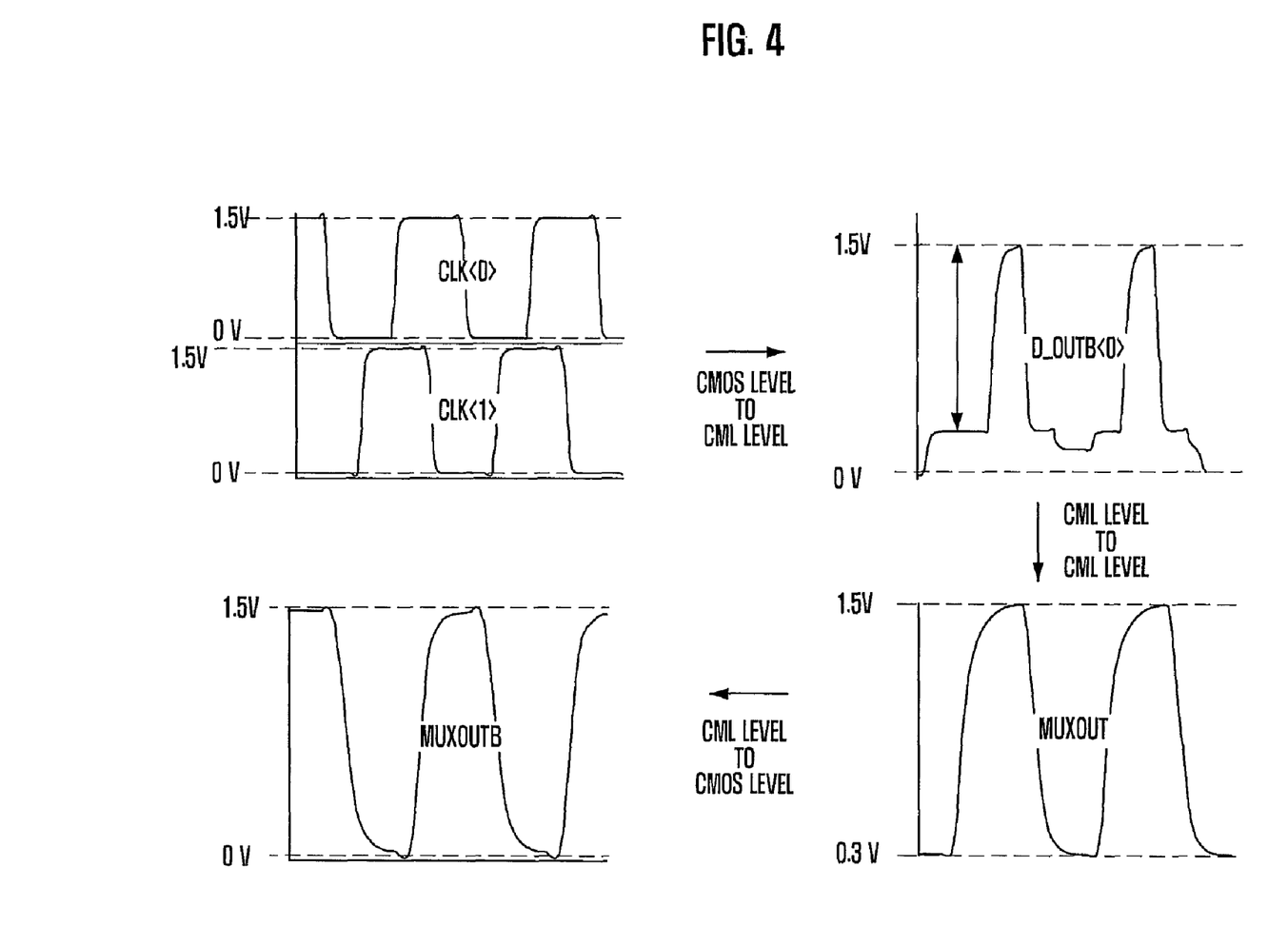
FIGS. 4 and 5 are simulation graphs indicating problems that may occur in the multiplexer with the single-ended scheme in the semiconductor device in accordance with the first embodiment of the present invention described in FIG. 2.
Figure 5:
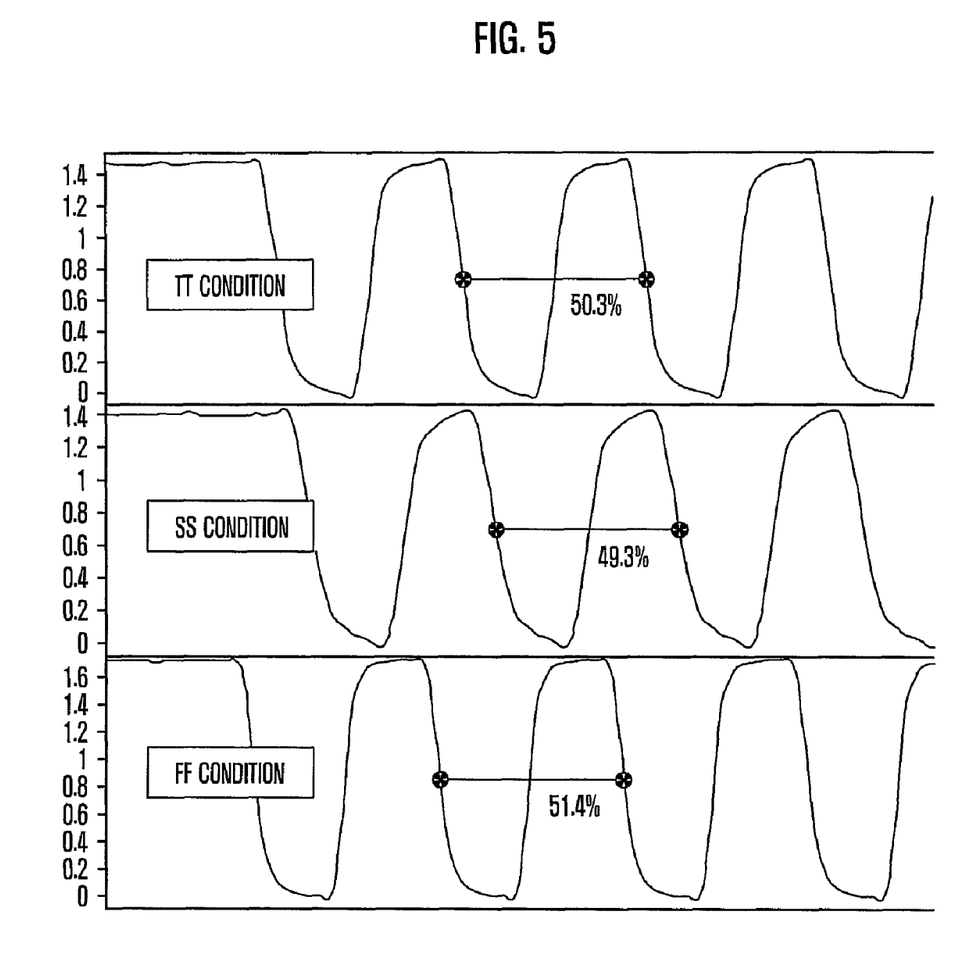

FIGS. 4 and 5 are simulation graphs indicating problems that may occur in the multiplexer with the single-ended scheme in the semiconductor device in accordance with the first embodiment of the present invention described in FIG. 2.

Referring to FIG. 4, it is noted that the multiplexer in accordance with the first embodiment of the present invention described in FIG. 2 should parallely receive the plurality of input/output signals D_IN<0>, D_IN<1>, D_IN<2>, and D_IN<3> swinging in the CMOS region and also control the plurality of signals D_OUT<0>, D_OUT<1>, D_OUT<2>, and D_OUT<3> that is serialized and outputted from the multiplexer to swing in the CMOS region.

First of all, the plurality of synchronization blocks 200A, 200B, 200C, and 200D among the components constructing the multiplexer in accordance with the first embodiment of the present invention described in FIG. 2 outputs the plurality of signals D_OUTB<0>, D_OUTB<1>, D_OUTB<2>, and D_OUTB<3> swinging in the CML region by its operation being turned on/off in response to the specific mode entry control signal SPE_MD_EN, although the plurality of input/output signals D_IN<0>, D_IN<1>, D_IN<2>, and D_IN<3> inputted thereto swings in the CMOS region.

In particular, considering the reasons why the plurality of signals D_OUTB<0>, D_OUTB<1>, D_OUTB<2>, and D_OUTB<3> outputted from the plurality of synchronization blocks 200A, 200B, 200C, and 200D swings in the CML region, it is required to see how the first sourcing bias unit 201A and the first sinking bias unit 203A among the components constructing the synchronization block 200A operates. The first sourcing bias unit 201A and the first sinking bias unit 203A control the on/off operation of the synchronization block 200A in response to the specific mode entry control signal SPE_MD_EN. The synchronization block 200A being turned on means that the first sourcing bias unit 201A is turned off and the first sinking bias unit 203A is turned on.

In case where the input/output signal D_IN<0> swinging in the CMOS region has a logic low level, since the VDD terminal and the signal output node D_OUT_ND<0> can be directly connected through the second sourcing bias unit 202A, the voltage level of the VDD terminal can be provided to the signal output node D_OUT_ND<0> without the potential level reduction. That is, the signals D_OUTB<0>, that should be outputted as a logic high level based on the input/output signals D_IN<0> having a logic low level, may have the same potential level as that of the supply voltage VDD without the potential level reduction.

However, in case the input/output signal D_IN<0> swinging in the CMOS region has a logic high level, the VSS terminal is connected through the first sinking bias unit 203A and the second sinking bias unit 204A to the signal output node D_OUT_ND<0>. Therefore, the potential level of the VSS terminal cannot be provided to the signal output node D_OUT_ND<0> without the potential level rise. That is, the signals D_OUTB<0>, that should be outputted as a logic low level based on the input/output signal D_IN<0> having a logic high level, may not have the same potential level as that of the ground voltage VSS without the potential level rise.

Accordingly, although the plurality of input/output signals D_IN<0>, D_IN<1>, D_IN<2>, and D_IN<3> inputted to the plurality of synchronization blocks 200A, 200B, 200C, and 200D swings in the CMOS region having a logic high state corresponding to the potential level of the supply voltage VDD and a logic low state corresponding to the potential level of the ground voltage VSS, the plurality of signals D_OUTB<0>, D_OUTB<1>, D_OUTB<2>, and D_OUTB<3> outputted from the plurality of synchronization blocks 200A, 200B, 200C, and 200D swings in the CML region having a logic high state corresponding to the potential level of the supply voltage VDD, and a logic low state corresponding to a potential level higher than the potential level of the ground voltage VSS.

Likewise, since the serialization block 220 among the components constructing the multiplexer in accordance with the first embodiment of the present invention is turned on/off in response to the specific mode entry control signal SPE_MD_EN, the plurality of signals D_OUTB<0>, D_OUTB<1>, D_OUTB<2> and D_OUTB<3> that is outputted as the serialized signal CML_MUXOUT unconditionally swings in the CML region regardless of a swing region of the plurality of signals D_OUTB<0>, D_OUTB<1>, D_OUTB<2> and D_OUTB<3> inputted to the serialization block 220.

Since the plurality of synchronization blocks 200A, 200B, 200C and 200D and the serialization block 220 output signals swinging in the CML region regardless of the swing level of the signals inputted thereto, as described in FIG. 4, the plurality of input/output signals D_IN<0>, D_IN<1>, D_IN<2>, and D_IN<3>, that are inputted in parallel and swing in the CMOS region, are outputted as the plurality of signals D_OUTB<0>, D_OUTB<1>, D_OUTB<2>, and D_OUTB<3> that swing in the CML region through the plurality of synchronization blocks 200A, 200B, 200C, and 200D. That is, the swing region of the signals is converted from the CMOS region to the CML region. Meanwhile, the plurality of signals D_OUTB<0>, D_OUTB<1>, D_OUTB<2> and D_OUTB<3>, that swing in the CML region and are outputted in parallel from the plurality of synchronization blocks 200A, 200B, 200C, and 200D, are outputted as the serialized signal CML_MUXOUT swinging in the CML region through the serialization block 220, and thus the swing region is not converted. The plurality of signals D_OUTB<0>, D_OUTB<1>, D_OUTB<2>, and D_OUTB<3>, that swing in the CML region and are outputted as the serialized signal CML_MUXOUT through the serialization block 220, are outputted as the serialized signal CMOS_MUXOUTB swinging in the CMOS region through the swing region converting block 240, and thus the swing region is converted from the CML region to the CMOS region.

Namely, in the multiplexer in accordance with the first embodiment of the present invention, although both of the plurality of input/output signals D_IN<0>, D_IN<1>, D_IN<2>, and D_IN<3> that are inputted in parallel and the plurality of signals D_OUT<0>, D_OUT<1>, D_OUT<2>, and D_OUT<3> that are serially outputted as the serialized signal CMOS_MUXOUTB definitely swing in the CMOS region, the swing region of the signals is converted from the CMOS region to the CML region and then from the CML region to the CMOS region in an intermediate process.

The intermediate process where the swing region of the signals is converted from the CMOS region to CML region and then from the CML region to the CMOS region is not stably performed and thus widths of the signals may be increased or decreased according to the variation of process, voltage and temperature (PVT). That is, the widths of the signals swinging in the CMOS region at first may be different from those of the signals whose swing region is converted from the CMOS region to the CML region and then from the CML region to the CMOS region again.

Therefore, when performing the operation of converting the signals swinging in the CMOS region to the signals swinging in the CML region and then converting the signals swinging in the CML region to the signals swinging in the CMOS region, a duty cycle ratio of the signals swinging in the CMOS region and a duty cycle ratio of the signals whose swing region is converted from the CMOS region to the CML region and then from the CML region to the CMOS region may be different from each other according to the variation of the PVT.

Referring to FIG. 5, it is noted that, when measuring duty cycle ratios of the signal outputted from the multiplexer with respect to the variation of the PVT, e.g., in TT condition/SS condition/FF condition, the difference between the measured duty cycle ratios becomes substantial. That is, the duty cycle ratio is 50.3% in the TT condition, the duty cycle ratio is 49.3% in the SS condition, and the duty cycle ratio is 51.4% in the FF condition, so that the difference between the maximum duty cycle ratio and the minimum duty cycle ratio becomes 2.1%.

Figure 6:
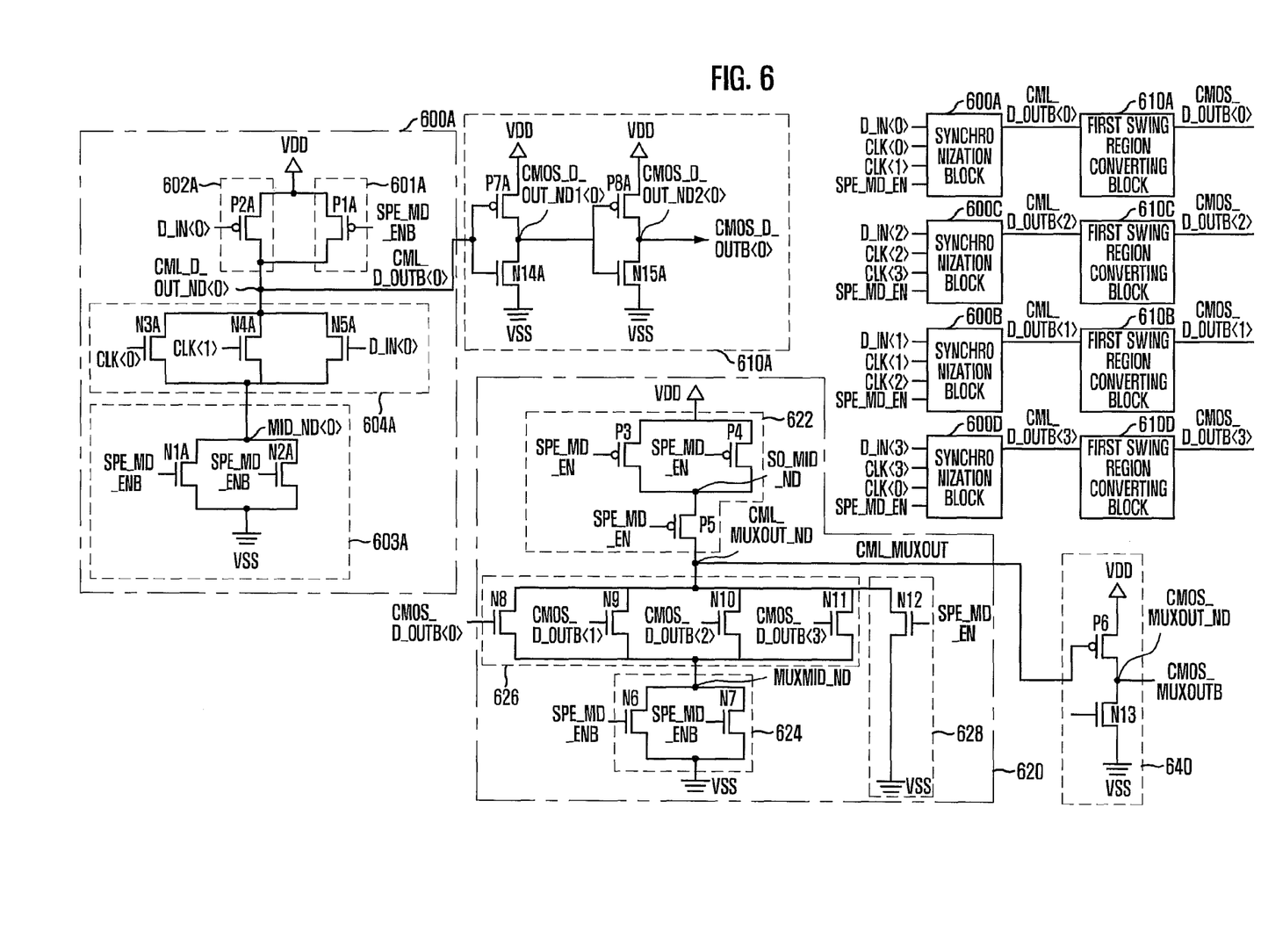
FIG. 6 illustrates a circuit diagram of a multiplexer with a single-ended scheme in a semiconductor device in accordance with a second embodiment of the present invention.

FIG. 6 illustrates a circuit diagram of a multiplexer with a single-ended scheme in a semiconductor device in accordance with a second embodiment of the present invention.

Since the multiplexer for serializing signals inputted/outputted to/from the semiconductor device in accordance with the second embodiment of the present invention employs the single-ended scheme, a plurality of input/output signals D_IN<0>, D_IN<1>, D_IN<2> and D_IN<3> inputted in parallel to the multiplexer swings in a CMOS region and a plurality of signals D_OUT<0>, D_OUT<1>, D_OUT<2> and D_OUT<3> outputted in series as a serialized signal CMOS_MUXOUTB from the multiplexer also swings in the CMOS region. That is, as described in the prior art, when a signal swinging in a CML region is transmitted through a circuit employing the single-ended scheme, a phase of the signal may be distorted or a potential level of the signal may be changed by noise. Therefore, in the circuit employing the single-ended scheme, a signal swinging in the CMOS region should be used.

Referring to FIG. 6, the multiplexer in accordance with the second embodiment of the present invention includes a plurality of synchronization blocks 600A, 600B, 600C and 600D, a plurality of first swing region converting blocks 610A, 610B, 610C and 610D, a serialization block 620, and a second swing region converting block 640.

The plurality of synchronization blocks 600A, 600B, 600C and 600D receives a plurality of input/output signals D_IN<0>, D_IN<1>, D_IN<2> and D_IN<3> swinging in the CMOS region, respectively, and sequentially synchronizes the received input/output signals D_IN<0>, D_IN<1>, D_IN<2> and D_IN<3> with multi-phase clock signals CLK<0>, CLK<1>, CLK<2> and CLK<3>, thereby outputting a plurality of signals CML_D_OUTB<0>, CML_D_OUTB<1>, CML_D_OUTB<2> and CML_D_OUTB<3>, respectively, wherein the plurality of signals CML_D_OUTB<0>, CML_D_OUTB<1>, CML_D_OUTB<2> and CML_D_OUTB<3> swing in the CML region.

The plurality of first swing region converting blocks 610A, 610B, 610C and 610D converts the plurality of signals CML_D_OUTB<0>, CML_D_OUTB<1>, CML_D_OUTB<2> and CML_D_OUTB<3> swinging in the CML region and outputted from the plurality of synchronization blocks 600A, 600B, 600C and 600D to swing in the CMOS region.

The serialization block 620 serializes a plurality of signals CMOS_D_OUTB<0>, CMOS_D_OUTB<1>, CMOS_D_OUTB<2> and CMOS_D_OUTB<3> swinging in the CMOS region and outputted from the plurality of first swing region converting blocks 610A, 610B, 610C and 610D, thereby outputting a serialized signal CML_MUXOUT swinging in the CML region.

The second swing region converting block 640 receives the serialized signal CML_MUXOUT including the serialized signals CMOS_D_OUTB<0>, CMOS_D_OUTB<1>, CMOS_D_OUTB<2> and CMOS_D_OUTB<3> and converts the serialized signal CML_MUXOUT to a serialized signal CMOS_MUXOUTB swinging in the CMOS region.

Herein, the plurality of synchronization blocks 600A, 600B, 600C and 600D and the serialization block 620 are turned on/off in response to a specific mode entry control signal SPE_MD_EN. This is to prevent the current consumption in the multiplexer when the multiplexer is not required to perform the serialization operation in a specific mode of the semiconductor device. The specific mode may include a power down mode or a test mode.

Because the plurality of synchronization blocks 600A, 600B, 600C, and 600D have the same configuration, except for inputted signals, the synchronization block 600A is illustrated in detail and will be described below for purposes of convenience. It should be understood that the description of the synchronization block 600A is applicable to the remaining blocks 600B, 600C, and 600D.

The synchronization block 600A includes a first sourcing bias unit 601A, a second sourcing bias unit 602A, a first sinking bias unit 603A, and a second sinking bias unit 604A.

The first sourcing bias unit 601A provides a source current supplied through a VDD terminal to a signal output node CML_D_OUT_ND<0, in response to the specific mode entry control signal SPE_MD_EN. The second sourcing bias unit 602A is connected with the first sourcing bias unit 601A in parallel and provides the source current to the signal output node CML_D_OUT_ND<0> in response to the input/output signal D_IN<0> that swings in the CMOS region.

The first sinking bias unit 603A provides a sinking current supplied through a VSS terminal to a middle node MID_ND<0> in response to the specific mode entry control signal SPE_MD_EN. The second sinking bias unit 604A provides the sinking current supplied through the middle node MID_ND<0> to the signal output node CML_D_OUT_ND<0> in response to two or more of the multi-phase clock signals CLK<0>, CLK<1>, CLK<2> and CLK<3>, e.g., CLK<0> and CLK<1>, and the input/output signal D_IN<0>, respectively.

Further, the first sourcing bias unit 601A includes a PMOS transistor P1A for controlling the connection of the VDD terminal and the signal output node CML_D_OUT_ND<0> in response to an inversion signal of the specific mode entry control signal SPE_MD_ENB inputted through its gate. The PMOS transistor P1A has a source connected to the VDD terminal and a drain connected to the signal output node CML_D_OUT_ND<0>.

The second sourcing bias unit 602A includes a PMOS transistor P2A for controlling the connection of the VDD terminal and the signal output nodes CML_D_OUT_ND<0> in response to the input/output signal D_IN<0> swinging in the CMOS region inputted through its gate. The plurality of PMOS transistors P2A, P2B, P2C, and P2D has a source connected to the VDD terminal and a drain connected to the signal output node CML_D_OUT_ND<0>.

The first sinking bias unit 603A includes a first NMOS transistor N1A and a second NMOS transistor N2A. The first NMOS transistor N1A and the second NMOS transistor N2A have a gate receiving the inversion signal of the specific mode entry control signal SPE_MD_ENB, a drain connected to the middle node MID_ND<0> and a source connected to the VSS terminal.

Herein, it is noted that the first NMOS transistor N1A and the second NMOS transistor N2A practically play the same role. This construction is prepared for the case where a signal coupled to the gate of the first NMOS transistor is different from that coupled to the gate of the second NMOS transistor. For instance, the specific mode entry control signal coupled to the gate of the first NMOS transistor N1A may be a signal for controlling a power down mode operation and the specific mode entry control signal coupled to the gate of the second NMOS transistor N2A may be a signal for controlling a test mode operation.

The second sinking bias unit 604A includes a first NMOS transistor N3A, a second NMOS transistor N4A, and a third NMOS transistor N5A. The first NMOS transistor N3A and the second NMOS transistor N4A have gates receiving two or more predetermined clock signals, e.g., CLK<0> and CLK<1>, among the multi-phase clock signals CLK<0>, CLK<1>, CLK<2> and CLK<3>, a drain connected to the signal output node CML_D_OUT_ND<0>, and a source connected to the middle node MID_ND<0>. The third NMOS transistor N5A has a gate receiving the input/output signal D_IN<0> swinging in the CMOS region, a drain connected to the signal output node CML_D_OUT_ND<0> and a source connected to the middle node MID_ND<0>.

The first swing region converting block 610A includes a first PMOS transistor P7A, a first NMOS transistor N14A, second PMOS transistor P8A, and a second NMOS transistor N15A.

The first PMOS transistor P7A has a gate receiving the signal CML_D_OUTB<0> swinging in the CML region and outputted from the synchronization block 600A, a source connected to the VDD terminal, and a drain connected to a first signal output node CMOS_D_OUT_ND1<0>. The first NMOS transistor N14A has a gate receiving the signals CML_D_OUTB<0> swinging in the CML region and outputted from the synchronization block 600A, a drain connected to the of first signal output node CMOS_D_OUT_ND1<0> and a source connected to the VSS terminal.

The second PMOS transistor P8A has a gate receiving a signal loaded on the first signal output node CMOS_D_OUT_ND1<0>, a source connected to the VDD terminal, and a drain connected to a second signal output node CMOS_D_OUT_ND2<0>. The second NMOS transistor 15A has a gate receiving the signal loaded on the first signal output node CMOS_D_OUT_ND1<0>, a drain connected to the second signal output node CMOS_D_OUT_ND2<0>, and a source connected to the VSS terminal.

The serialization block 620 includes a sourcing bias unit 622 for providing a signal output node CML_MUXOUT_ND with the source current supplied through the VDD terminal in response to the specific mode entry control signal SPE_MD_EN, a first sinking bias unit 624 for providing a middle node MUXMID_ND with the sinking current supplied through the VSS terminal in response to the specific mode entry control signal SPE_MD_EN, a second sinking bias unit 626 for providing the signal output node CML_MUXOUT_ND with the sinking current supplied through the middle node MUXMID_ND in response to the plurality of signals CMS_D_OUTB<0>, CMS_D_OUTB<1>, CMS_D_OUTB<2>, and CMS_D_OUTB<3> swinging in the CML region and outputted from the plurality of swing region converting blocks 610A, 610B, 610C and 610D, and a third sinking bias unit 628 for providing the signal output node CML_MUXOUT_ND with the sinking current supplied through the VSS terminal in response to the specific mode entry control signal SPE_MD_EN.

The sourcing bias unit 622 of the serialization block 620 includes a plurality of first PMOS transistors P3 and P4 and a second PMOS transistor P5, where the first PMOS transistors P3 and P4 have gates receiving the specific mode entry control signal SPE_MD_EN, sources connected to the VDD terminal and drains connected to a sourcing middle node SO_MID_ND, and the second PMOS transistor P5 has a gate receiving the specific mode entry control signal SPE_MD_EN, a source connected to the sourcing middle node SO_MID_ND, and a drain connected to the signal output node CML_MUXOUT_ND.

It is noted that the first PMOS transistors P3 and P4 included in the sourcing bias unit 622 practically play the same role. This construction is prepared for the case a signal coupled to the gate of the PMOS transistor P3 is different from that coupled to the gate of the PMOS transistor P4. For instance, the specific mode entry control signal coupled to the gate of the PMOS transistor P3 may be a signal for controlling the power down mode operation and the specific mode entry control signal coupled to the gate of the PMOS transistor P4 may be a signal for controlling the test mode operation.

Moreover, it is noted that the first PMOS transistors P3 and P4 and the second PMOS transistor P5 included in the sourcing bias unit 622 are serially connected to each other in the same structure. This is to adjust a level range of the CMOS region where the plurality of signals CMOS_D_OUTB<0>, CMOS_D_OUTB<1>, CMOS_D_OUTB<2>, and CMOS_D_OUTB<3> swings by further itemizing and optimizing the amount of the source current supplied to the signal output node CML_MUXOUT_ND from the VDD terminal, where the plurality of signals CMOS_D_OUTB<0>, CMOS_D_OUTB<1>, CMOS_D_OUTB<2>, and CMOS_D_OUTB<3> is sequentially driven to the signal output node CML_MUXOUT_BD in a state of swinging in the CMOS region.

The first sinking bias unit 624 includes a plurality of NMOS transistors N6 and N7 having gates receiving the inversion signal of the specific mode entry control signal SPE_MD_ENB, drains connected to the middle node MUXMID_ND and sources connected to the VSS terminal.

Herein, it is noted that the transistors N6 and N7 practically play the same role. This construction is prepared for the case where the inversion signal of the specific mode entry control signal SPE_MD_ENB coupled to the gate of the NMOS transistor N6 is different from that coupled to the gate of the NMOS transistor N7. For instance, the inversion signal of the specific mode entry control signal coupled to the gate of the NMOS transistor P6 may be a signal for controlling the power down mode operation and the inversion signal of the specific mode entry control signal coupled to the gate of the NMOS transistor N7 may be a signal for controlling the test mode operation.

The second sinking bias unit 626 includes a plurality of NMOS transistors N8, N9, N10 and N11 having gates receiving the plurality of signals CMOS_D_OUTB<0>, CMOS_D_OUTB<1>, CMOS_D_OUTB<2> and CMOS_D_OUTB<3>, respectively, that swings in the CMOS region and is outputted from the plurality of first swing region converting blocks 610A, 610B, 610C and 610D, drains connected to the signal output node CML_MUXOUT_ND, and sources connected to the middle node MUXMID_ND, respectively.

The third sinking bias unit 628 includes an NMOS transistor N12 having a gate receiving the specific mode entry control signal SPE_MD_EN, a drain connected to the signal output node CML_MUXOUT_ND and a source connected to the VSS terminal.

The second swing region converting block 640 includes a PMOS transistor P6 and an NMOS transistor N13. The PMOS transistor P6 has a gate receiving an output signal CML_MUXOUT of the serialization block 620, a source connected to the VDD terminal and a drain connected to a signal output node CMOS_MUXOUT_ND. The NMOS transistor N13 has a gate receiving the output signal CML_MUXOUT of the serialization block 620, a drain connected to the signal output node CMOS_MUXOUT_ND, and a source connected to the VSS terminal.

An operation of the multiplexer employing the single-ended scheme to serialize the signals inputted/outputted to/from the semiconductor device in accordance with the second embodiment of the present invention will be described hereinafter with reference to the above-described structure.

Figure 7:
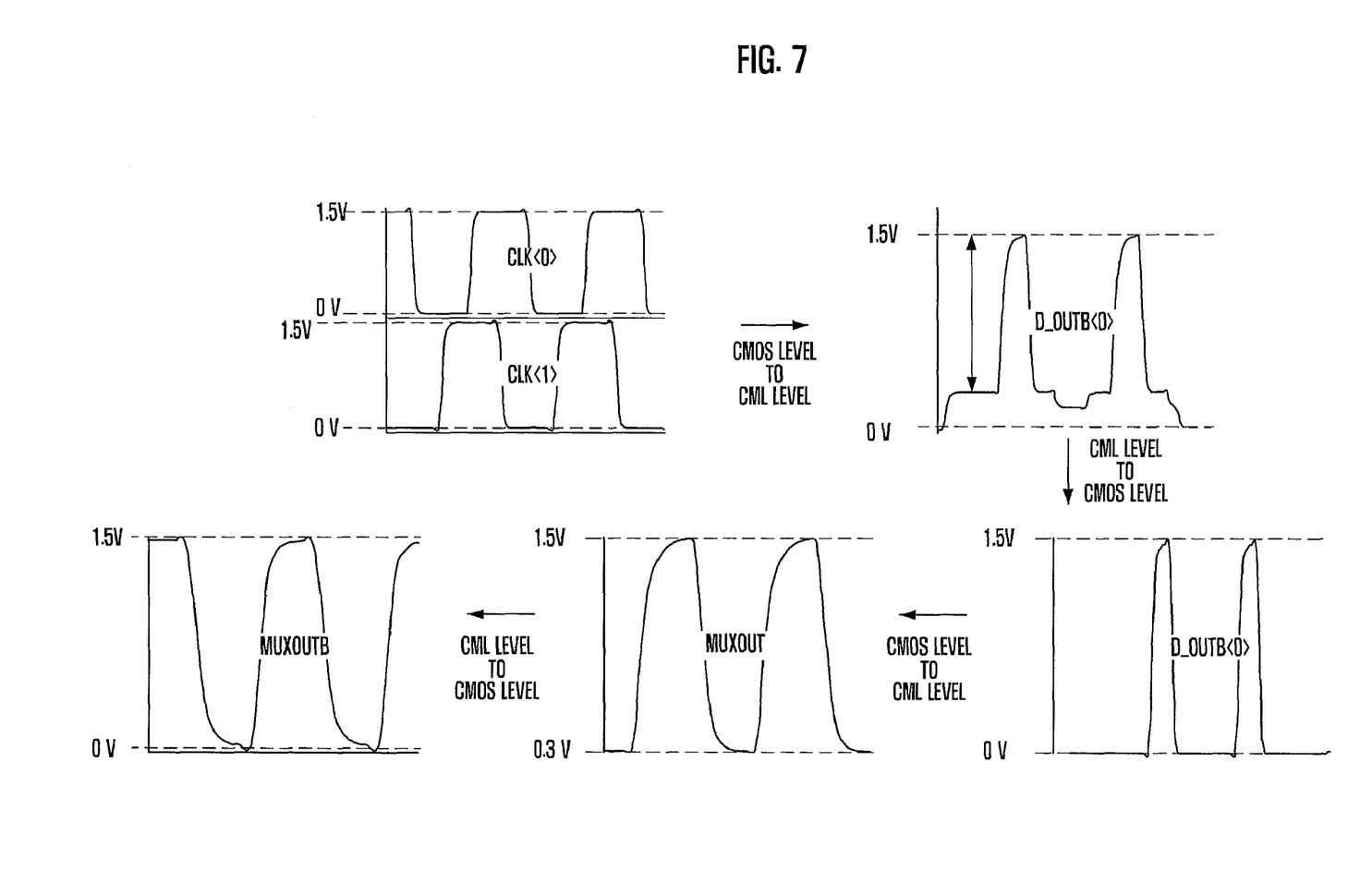
FIGS. 7 and 8 are simulation graphs illustrating operational waveforms of the multiplexer with the single-ended scheme in the semiconductor device in accordance with the second embodiment of the present invention described in FIG. 6.
Figure 8:
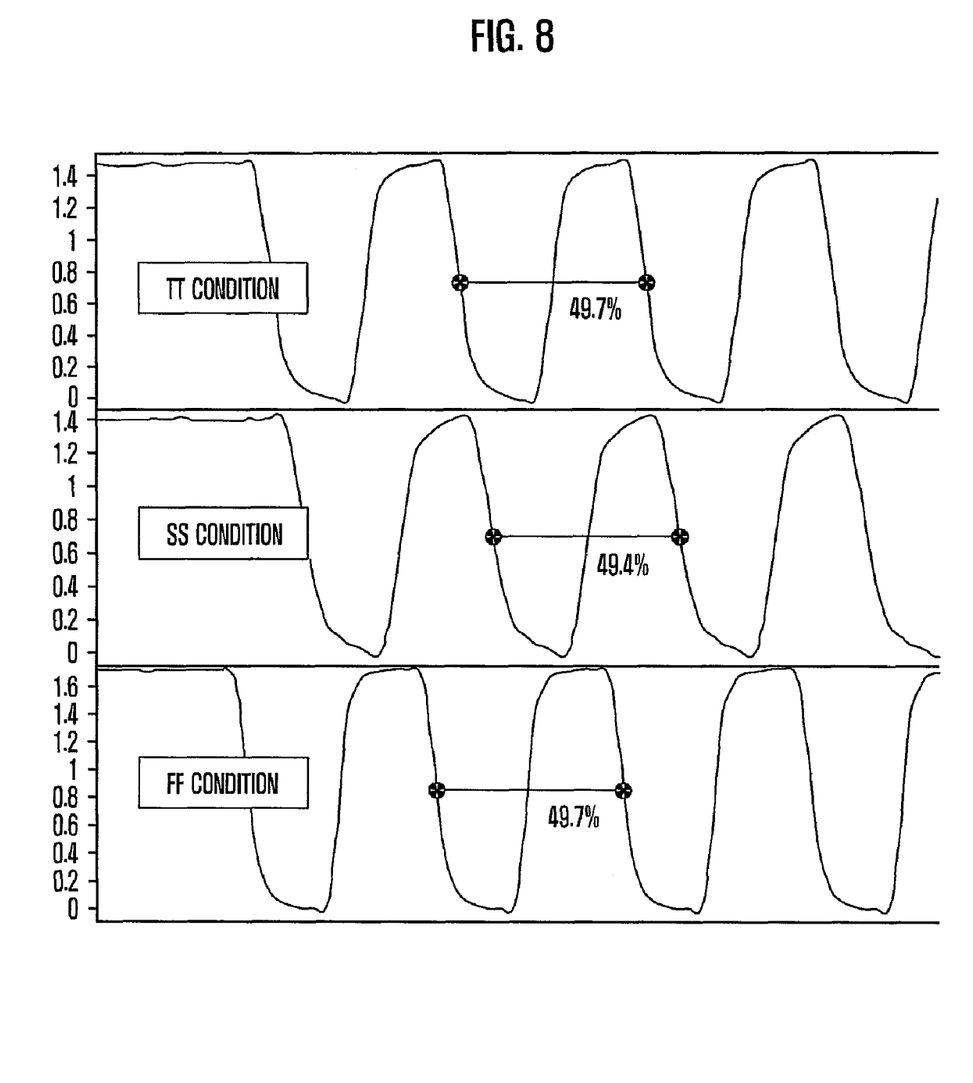

FIGS. 7 and 8 are simulation graphs illustrating operational waveforms of the multiplexer with the single-ended scheme in the semiconductor device in accordance with the second embodiment of the present invention described in FIG. 6.

Referring to FIG. 7, it is noted that the multiplexer with the single-ended scheme in the semiconductor device in accordance with the second embodiment of the present invention described in FIG. 6 should receive, in parallel, the plurality of input/output signals D_IN<0>, D_IN<1>, D_IN<2> and D_IN<3> swinging in the CMOS region and output a plurality of signals D_OUT<0>, D_OUT<1>, D_OUT<2> and D_OUT<3> as the serialized signal CMOS_MUXOUT, swinging in the CMOS region.

First of all, the plurality of synchronization blocks 600A, 600B, 600C and 600D among the components constructing the multiplexer in accordance with the second embodiment of the present invention described in FIG. 6 outputs the plurality of signals CML_D_OUTB<0>, CML_D_OUTB<1>, CML_D_OUTB<2> and CML_D_OUTB<3> swinging in the CML region by its operation being turned on/off in response to the specific mode entry control signal SPE_MD_EN although the plurality of input/output signals D_IN<0>, D_IN<1>, D_IN<2> and D_IN<3> inputted thereto swings in the CMOS region.

In particular, considering the reasons why the plurality of signals CML_D_OUTB<0>, CML_D_OUTB<1>, CML_D_OUTB<2>, and CML_D_OUTB<3> outputted from the plurality of synchronization blocks 600A, 600B, 600C and 600D swings in the CML region, it is required to see how the first sourcing bias unit 601A and the first sinking bias unit 603A among the components constructing the synchronization block 600A operate. The first sourcing bias unit 601A and the first sinking bias unit 603A control the on/off operation of the synchronization block 600A in response to the specific mode entry control signal SPE_MD_EN. The synchronization block 600A being turned on means that the first sourcing bias unit 601A is turned off and the first sinking bias unit 603A is turned on.

In case the input/output signals D_IN<0> swinging in the CMOS region has a logic low level, since the VDD terminal and the signal output node CML_D_OUT_ND<0> can be directly connected through the second sourcing bias unit 602A, the voltage level of the VDD terminal can be provided to the signal output node CML_D_OUT_ND<0> without the potential level reduction. That is, the signals CML_D_OUTB<0> that should be outputted as a logic high level based on the input/output signal D_IN<0> having a logic low level may have the same potential level as that of the supply voltage VDD without the potential level reduction.

However, in case the input/output signal D_IN<0> swinging in the CMOS region has a logic high level, the VSS terminal is connected through the first sinking bias unit 603A and the second sinking bias unit 604A to the signal output node CML_D_OUT_ND<0>. Therefore, the potential level of the VSS terminal cannot be provided to the signal output node CML_D_OUT_ND<0> without the potential level rise. That is, the signals CML_D_OUTB<0> that should be outputted as a logic low level based on the input/output signal D_IN<0> having a logic high level may not have the same potential level as that of the ground voltage VSS without the potential level rise.

Accordingly, although the plurality of input/output signals D_IN<0>, D_IN<1>, D_IN<2> and D_IN<3> inputted to the plurality of synchronization blocks 600A, 600B, 600C and 600D swings in the CMOS region having a logic high state corresponding to the potential level of the supply voltage VDD, and a logic low state corresponding to the potential level of the ground voltage VSS, the plurality of signals CML_D_OUTB<0>, CML_D_OUTB<1>, CML_D_OUTB<2> and CML_D_OUTB<3> outputted from the plurality of synchronization blocks 600A, 600B, 600C and 600D swings in the CML region having a logic high state corresponding to the potential level of the supply voltage VDD and a logic low state corresponding to a potential level higher than the potential level of the ground voltage VSS.

Likewise, since the serialization block 620 among the components constructing the multiplexer in accordance with the second embodiment of the present invention is turned on/off in response to the specific mode entry control signal SPE_MD_EN, the plurality of signals D_OUTB<0>, D_OUTB<1>, D_OUTB<2> and D_OUTB<3>, that is outputted as the serialized signal CML_MUXOUT, unconditionally swings in the CML region regardless of a swing region of the plurality of signals CMOS_D_OUTB<0>, CMOS_D_OUTB<1>, CMOS_D_OUTB<2> and CMOS_D_OUTB<3> outputted from the plurality of first swing region converting blocks 610A, 610B, 610C and 610D and inputted to the serialization block 620.

The plurality of synchronization blocks 600A, 600B, 600C, and 600D and the serialization block 620 have output signals whose swing level is in the CML region regardless of the swing level of the signals inputted thereto. In addition, the multiplexer employs the plurality of first swing region converting blocks 610A, 610B, 610C and 610D between the plurality of synchronization blocks 600A, 600B, 600C and 600D and the serialization block 620, and the second swing region converting block 640 connected to the signal output node CML_MUXOUT of the serialization block 620. As such, both of the plurality of input/output signals D_IN<0>, D_IN<1>, D_IN<2> and D_IN<3>, that is inputted in parallel, and the plurality of signals D_OUT<0>, D_OUT<1>, D_OUT<2> and D_OUT<3>, that is serially outputted as the serialized signal CMOS_MUXOUTB swing in the CMOS region.

The plurality of input/output signals D_IN<0>, D_IN<1>, D_IN<2>, and D_IN<3>, that are inputted in parallel and swing in the CMOS region, are outputted in parallel as the plurality of signals CML_D_OUTB<0>, CML_D_OUTB<1>, CML_D_OUTB<2>, and CML_D_OUTB<3> swinging in the CML region through the plurality of synchronization blocks 600A, 600B, 600C, and 600D, and thus the swing region of the signals is converted from the CMOS region to the CML region. The plurality of signals CML_D_OUTB<0>, CML_D_OUTB<1>, CML_D_OUTB<2> and CML_D_OUTB<3>, that are outputted in parallel from the plurality of synchronization blocks 600A, 600B, 600C and 600D and swinging in the CML region, are outputted in parallel as the plurality of signals CMOS_D_OUTB<0>, CMOS_D_OUTB<1>, CMOS_D_OUTB<2> and CMOS_D_OUTB<3> swinging in the CMOS region through the plurality of first swinging region converting blocks 610A, 610B, 610C and 610D, and thus the swing region of the signals is converted from the CML region to the CMOS region. The plurality of signals CMOS_D_OUTB<0>, CMOS_D_OUTB<1>, CMOS_D_OUTB<2> and CMOS_D_OUTB<3>, that are outputted in parallel from the plurality of first swinging region converting blocks 610A, 610B, 610C and 610D and swinging in the CMOS region, are outputted as the serialized signal CML_MUXOUT swinging in the CML region through the serialization block 620, and thus the swing region of the signals is converted from the CMOS region to the CML region again. The serialized signal CML_MUXOUT, that is outputted from the serialization block 620 and swinging in the CML region, is outputted as the serialized signal CMOS_MUXOUTB swinging in the CMOS region through the second swing region converting block 640, and thus the swing region of the signals is converted from the CML region to the CMOS region again.

Namely, in the multiplexer in accordance with the second embodiment of the present invention, although both of the plurality of input/output signals D_IN<0>, D_IN<1>, D_IN<2> and D_IN<3> that are inputted in parallel and the plurality of signals D_OUT<0>, D_OUT<1>, D_OUT<2> and D_OUT<3> that are serially outputted as the serialized signal CMOS_MUXOUTB definitely swing in the CMOS region, the swing region of the signals is converted from the CMOS region to the CML region, from the CML region to the CMOS region, from the CMOS region to the CML region and from the CML region to the CMOS region in intermediate processes.

The intermediate processes where the swing region of the signals is converted from the CMOS region to CML region and then from the CML region to the CMOS region are not stably performed Instead, widths of the signals may be increased or decreased according to the variation of process, voltage and temperature (PVT). That is, the widths of the signals swinging in the CMOS region may be different from those of the signals whose swing region is converted from the CMOS region to the CML region and then from the CML region to the CMOS region again.

Therefore, when considering the operation of converting the signals swinging in the CMOS region to the signals swinging in the CML region and then to the signals swinging in the CMOS region, like in the first embodiment, the second embodiment of the present invention also shows that a duty cycle ratio of the signals swinging in the CMOS region at first and a duty cycle ratio of the signals whose swing region is converted from the CMOS region to the CML region and then from the CML region to the CMOS region may be different from each other according to the variation of the PVT.

However, in the second embodiment of the present invention, the operation where the signals swinging in the CMOS region are converted to the signals swinging in the CML region and then to the signals swinging in the CMOS region is continuously performed two times. At this time, the inputted signals swinging in the CMOS region and the outputted signals swinging in the CMOS region in a first operation, where the signals swinging in the CMOS region are converted to the signals swinging in the CML region and then to the signals swinging in the CMOS region, have contrary phases. Furthermore, the inputted signals swinging in the CMOS region and the outputted signals swinging in the CMOS region in a second operation, where the signals swinging in the CMOS region are converted to the signals swinging in the CML region and then to the signals swinging in the CMOS region, also have contrary phases. Therefore, by a principle that the variation of duty cycle ratios is countervailed when the same structure is repeated an even number of times, in the second embodiment of the present invention, the duty cycle ratio of the first and foremost signal swinging in the CMOS region becomes identical to the duty cycle ratio of the last signal swinging in the CMOS region.

In particular, considering the variation of the duty cycle ratio occurring when first performing the operation where the signals swinging in the CMOS region are converted to the signals swinging in the CML region and then to the signals swinging in the CMOS region, since the inputted signal swinging in the CMOS region and the outputted signal swinging in the CMOS region have contrary phases when the variation of the duty cycle ratio occurs by 'A' at a rising edge of the inputted signal region and by 'B' at a falling edge of the inputted signal, the variation of the duty cycle ratio occurs by 'A' at a falling edge of the outputted signal and by 'B' at a rising edge of the outputted signal.

Likewise, considering the variation of the duty cycle ratio occurring when secondly performing the operation where the signals swinging in the CMOS region are converted to the signals swinging in the CML region and then to the signals swinging in the CMOS region, since the inputted signal swinging in the CMOS region and the outputted signal swinging in the CMOS region have contrary phases when the variation of the duty cycle ratio occurs by 'A' at the rising edge of the inputted signal and by 'B' at the falling edge of the inputted signal, the variation of the duty cycle ratio occurs by 'A' at the falling edge of the outputted signal and by 'B' at the rising edge of the outputted signal.

Considering both of the first operation and the second operation at the same time, the variation of the duty cycle ratio occurs by 'A+B' at the rising edge and by 'A+B' at the falling edge until the signal inputted in the first operation and swinging in the CMOS region becomes the signal outputted in the second operation and swinging in the CMOS region. The duty cycle ratio of the signal inputted in the first operation and swinging in the CMOS region is identical to the duty cycle ratio of the signal outputted in the second operation and swinging in the CMOS region.

Referring to FIG. 8, it is noted that, when measuring duty cycle ratios of the signal outputted from the multiplexer with respect to the variation of the PVT, e.g., in TT condition/SS condition/FF condition, the difference between the measured duty cycle ratios becomes insignificant. That is, the duty cycle ratio is 49.7% in the TT condition, the duty cycle ratio is 49.4% in the SS condition, and the duty cycle ratio is 49.7% in the FF condition, so that the difference between the maximum duty cycle ratio and the minimum duty cycle ratio barely becomes 0.3%.

As described above, when adopting the second embodiment of the present invention, it is possible to simplify the circuit of the multiplexer by implementing the multiplexer, which serializes input/output signals in response to the multi-phase clock signals CLK<0>, CLK<1>, CLK<2>, and CLK<3>, using the single-ended scheme. As a result, it is possible to significantly reduce the area occupied by the multiplexer in the semiconductor device and thus to further minimize the size of the semiconductor device.

Moreover, when implementing the multiplexer for serializing the input/output signals in response to the multi-phase clock signals with the single-ended scheme, it is possible to prevent distortion of the duty cycle ratio of the input/output signals from occurring in the process of serializing the input/output signals.

While the present invention has been described with respect to the specific embodiments, it will be apparent to those skilled in the art that various changes and modifications may be made without departing from the spirit and scope of the invention as defined in the following claims.

For instance, in the above embodiments of the present invention, although the number of clock signals having predetermined phase differences that are included in the multi-phase clock signals is 4, it is only for the sake of explanation. Thus, in accordance with another embodiment of the present invention, the number of clock signals may be greater or smaller than 4.

Moreover, the above illustrated logic gates and transistors may be implemented to have different locations and types according to polarities of signals inputted thereto.

What is claimed is:

1. A semiconductor device, comprising:
    a plurality of synchronization blocks configured to sequentially synchronize a plurality of input signals swinging in a complementary metal oxide semiconductor (CMOS) region with multi-phase clock signals and to output a plurality of output signals swinging in a current mode logic (CML) region;
    a plurality of first swing region converting blocks configured to convert the plurality of output signals to a plurality of converted output signals swinging in the CMOS region;
    a serialization block configured to serialize the plurality of converted output signals, thereby outputting a serialized signal swinging in the CML region; and
    a second swing region converting block configured to convert the serialized signal to a serialized output signal swinging in the CMOS region.

2. The semiconductor device of claim 1, wherein the plurality of synchronization blocks is controlled to be turned on or off in response to a specific mode entry control signal.

3. The semiconductor device of claim 1, wherein each of the plurality of synchronization blocks comprises:
    a pull-up driving unit configured to pull-up drive a signal output node in response to a specific mode entry control signal and the input signals; and
    a pull-down driving unit configured to pull-down drive the signal output node in response to the multi-phase clock signals, the input signal and the specific mode entry control signal.

4. The semiconductor device of claim 1, wherein each of the synchronization blocks comprises:
    a first sourcing bias unit configured to provide a signal output node with a source current supplied through a supply voltage terminal in response to a specific mode entry control signal;
    a second sourcing bias unit connected to the first sourcing bias unit in parallel and configured to provide the signal output node with the source current in response to the input signals;
    a first sinking bias unit configured to provide an intermediate node with a sinking current supplied through a ground voltage terminal in response to the specific mode entry control signal; and
    a second sinking bias unit configured to provide the signal output node with the sinking current supplied through the intermediate node in response to the input signals and two or more predetermined clock signals among the multi-phase clock signals.

5. The semiconductor device of claim 1, wherein the serialization block is controlled to be turned on or off in response to a specific mode entry control signal.

6. The semiconductor device of claim 1, wherein the serialization block comprises:
    a pull-up driving unit configured to pull-up drive a signal output node in response to a specific mode entry control signal; and
    a pull-down driving unit configured to pull-down drive the signal output node in response to the specific mode entry control signal and the plurality of converted output signals.

7. The semiconductor device of claim 1, wherein the serialization block comprises:
    a sourcing bias unit configured to provide a signal output node with a source current supplied through a supply voltage terminal in response to the specific mode entry control signal;
    a first sinking bias unit configured to provide an intermediate node with a sinking current supplied through a ground voltage terminal in response to the specific mode entry control signal;
    a second sinking bias unit configured to provide the signal output node with the sinking current supplied through the intermediate node in response to the plurality of converted output signals; and a third sinking bias unit configured to provide the signal output node with the sinking current in response to the specific mode entry control signal.

8. The semiconductor device of claim 1, wherein the second swing region converting block drives a signal output node with a supply voltage and a ground voltage in response to the serialized signal swinging in the CML region, thereby outputting the serialized output signal loaded on the signal output node to swing in the CMOS region.

9. The semiconductor device of claim 1, wherein the multi-phase clock signals include a plurality of clock signals having predetermined phase differences.

10. The semiconductor device of claim 2, wherein a specific mode defined by the specific mode entry control signal includes a power down mode or a test mode.

11. A method for serializing a plurality of input signals inputted in parallel, the method comprising:
   sequentially outputting a plurality of output signals swinging in a current mode logic (CML) region, in parallel, by synchronizing the plurality of input signals swinging in a complementary metal oxide semiconductor (CMOS) region with multi-phase clock signals;
   converting a swing region of the plurality of output signals to the CMOS region;
   outputting serialized signals swinging in the CML region by serializing the converted plurality of output signals; and
   converting a swing region of the serialized signals swinging in the CML region to the CMOS region.

12. The method of claim 11, wherein sequentially outputting the plurality of output signals swinging in the CML region comprises:
   receiving, in parallel, the plurality of input signals swinging in the CMOS region; and
   synchronizing the plurality of input signals at sequential multiple points of time corresponding to the multi-phase clock signals, thereby outputting, in parallel, the plurality of output signals swinging in the CML region.

13. The method of claim 11, wherein converting the swing region of the plurality of output signals comprises:
   converting a swing region of each of the plurality of output signals swinging in the CML region inputted at sequential multiple points of time different from each other to the CMOS region; and
   outputting, in parallel, the converted signals at sequential multiple points of time.

14. The method of claim 11, wherein outputting the serialized signals swinging in the CML region comprises
   driving the converted output signals, that are inputted in parallel at sequential multiple points of time different from each other, in order of being received through one output node.

15. The method of claim 11, wherein the multi-phase clock signals include a plurality of clock signals having predetermined phase differences.

* * * * *